(12) United States Patent
Meiser et al.

(10) Patent No.: US 10,128,750 B2
(45) Date of Patent: Nov. 13, 2018

(54) SWITCHED-MODE POWER CONVERTER WITH AN INDUCTIVE STORAGE ELEMENT AND A CASCODE CIRCUIT

(71) Applicant: Infineon Technologies AG, Neubiberg (DE)

(72) Inventors: Andreas Meiser, Sauerlach (DE); Steffen Thiele, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/060,737

(22) Filed: Mar. 4, 2016

(65) Prior Publication Data

US 2017/0257025 A1   Sep. 7, 2017

(51) Int. Cl.
| | | |
|---|---|---|
| *H02M 3/156* | (2006.01) |
| *H01L 29/10* | (2006.01) |
| *H01L 29/06* | (2006.01) |
| *H01L 29/40* | (2006.01) |
| *H01L 29/78* | (2006.01) |

(52) U.S. Cl.
CPC ......... *H02M 3/156* (2013.01); *H01L 29/063* (2013.01); *H01L 29/1095* (2013.01); *H01L 29/407* (2013.01); *H01L 29/7825* (2013.01); *H01L 29/7831* (2013.01)

(58) Field of Classification Search
CPC ..... H02M 3/156; H02M 3/158; H02M 3/1588
See application file for complete search history.

(56) References Cited

U.S. PATENT DOCUMENTS

| | | | |
|---|---|---|---|
| 6,359,498 B1 * | 3/2002 | Kurihara ................. | H03G 1/04 327/513 |
| 2005/0146940 A1 | 7/2005 | Hofmann et al. | |
| 2006/0125044 A1 | 6/2006 | Haller et al. | |
| 2008/0017845 A1 | 1/2008 | Drndic et al. | |
| 2009/0073111 A1 * | 3/2009 | Miyazaki ............... | G09G 3/344 345/107 |
| 2014/0015592 A1 * | 1/2014 | Weis .................... | H03K 17/102 327/430 |
| 2014/0151798 A1 | 6/2014 | Meiser et al. | |
| 2015/0137224 A1 | 5/2015 | Meiser et al. | |

FOREIGN PATENT DOCUMENTS

JP         52036483 A  *  3/1977  ......... H01L 27/0623

* cited by examiner

*Primary Examiner* — Jue Zhang
*Assistant Examiner* — Lakaisha Jackson
(74) *Attorney, Agent, or Firm* — Murphy, Bilak & Homiller, PLLC

(57) ABSTRACT

A switched-mode power converter includes an inductive storage element and a cascode circuit. The cascode circuit includes a double-gate field effect transistor. A switchable load path of the double-gate field effect transistor is electrically connected in series with the inductive storage element.

17 Claims, 14 Drawing Sheets

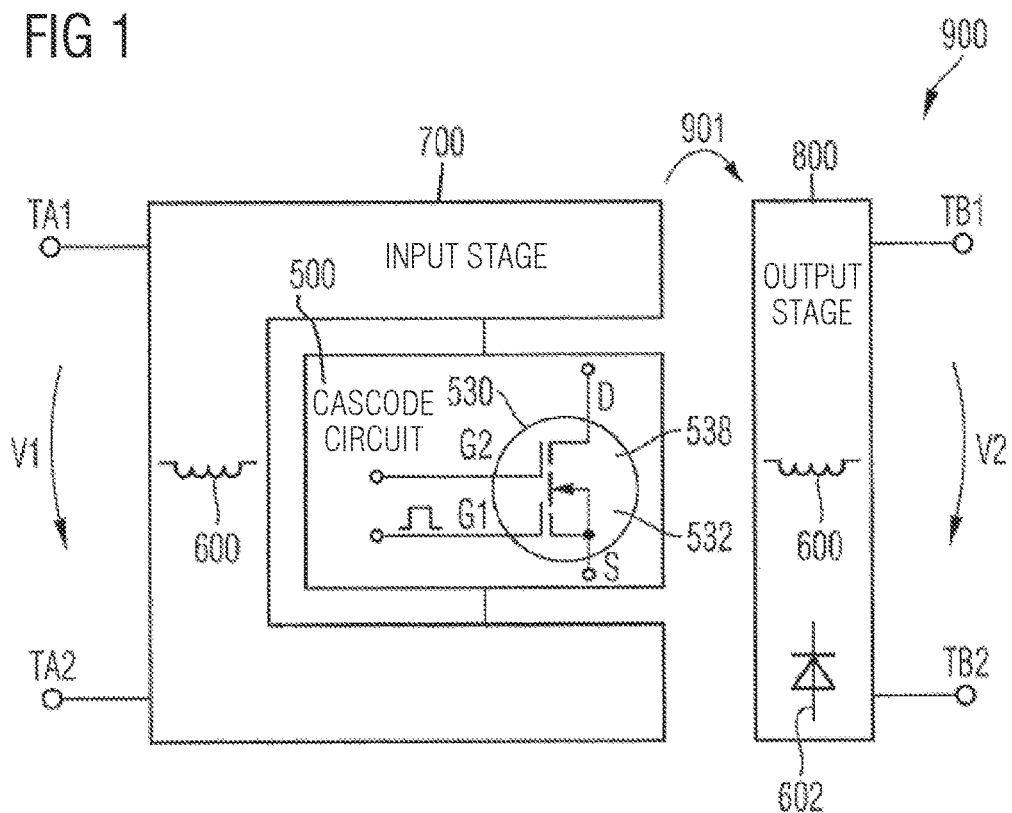

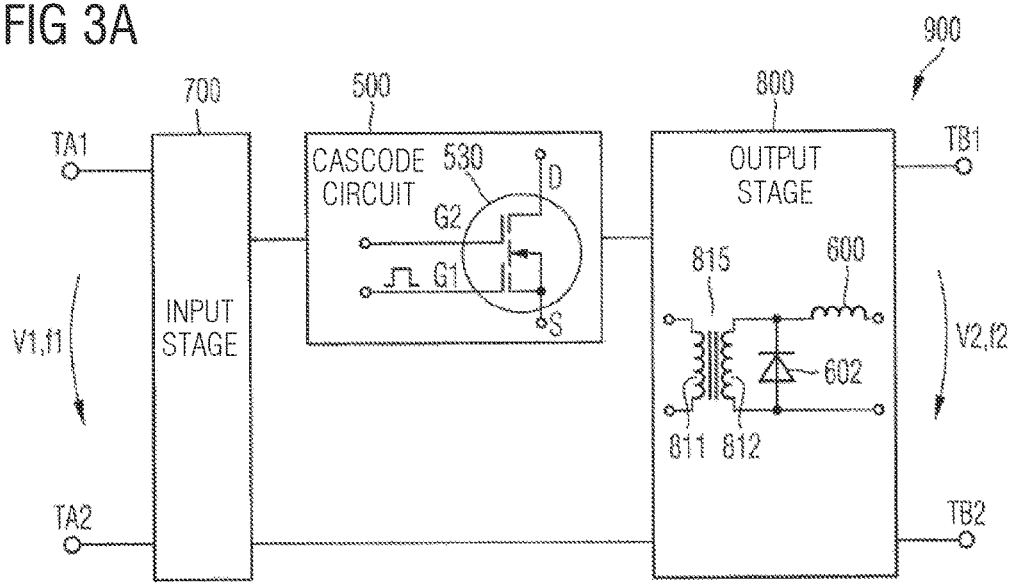
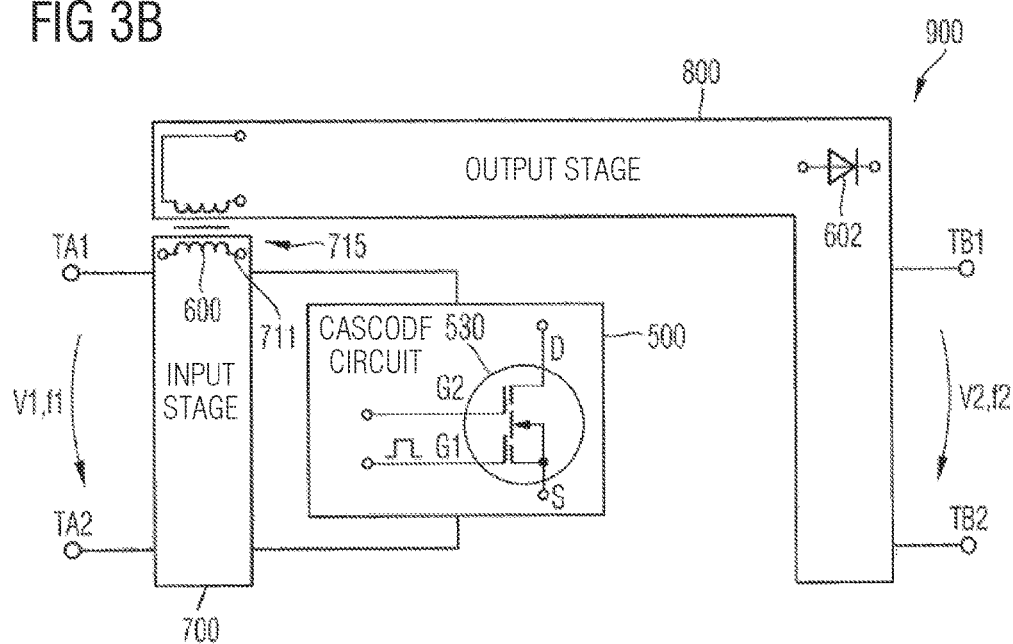

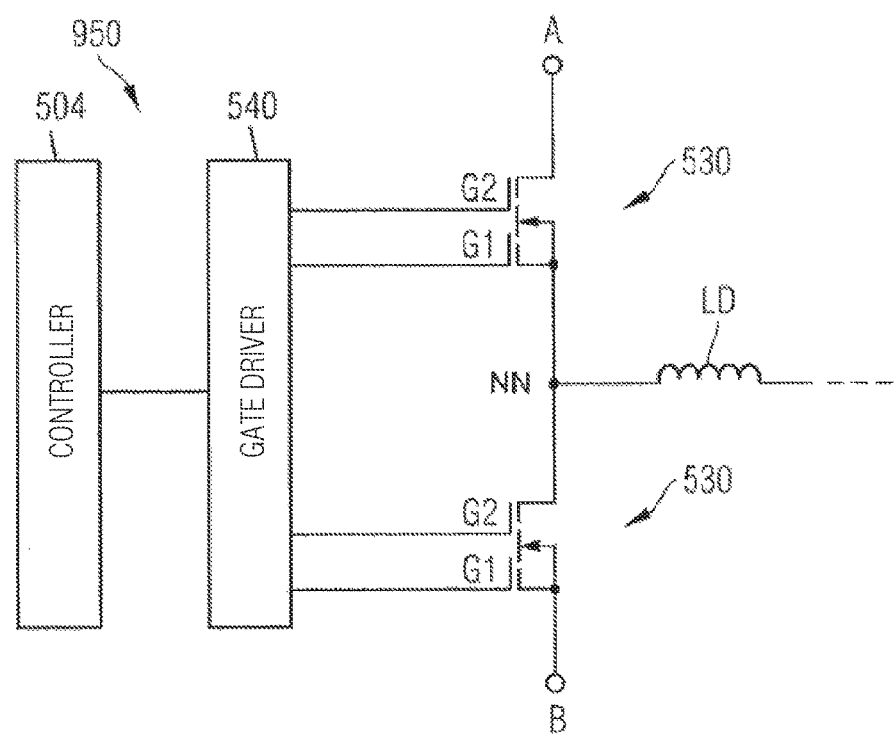

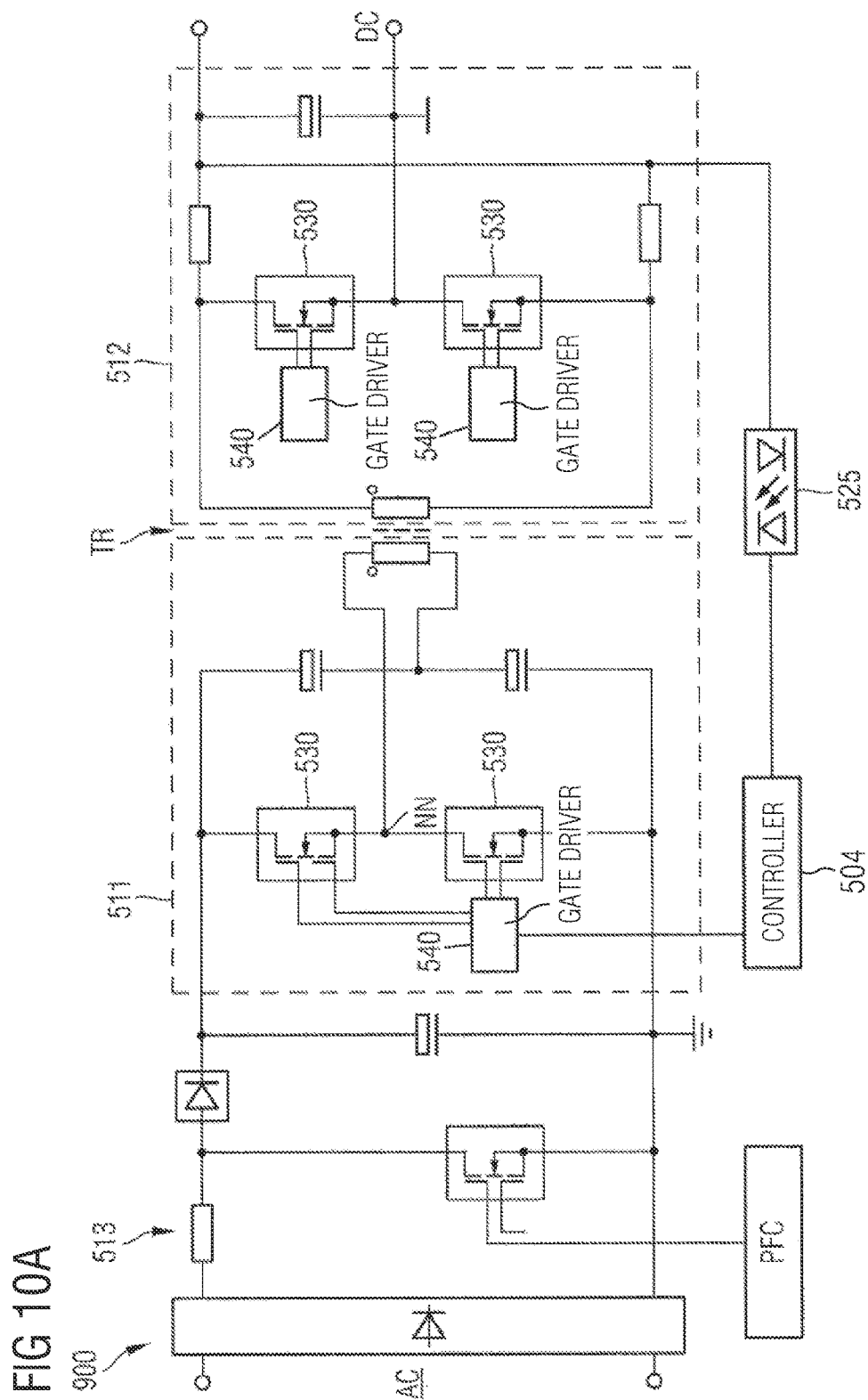

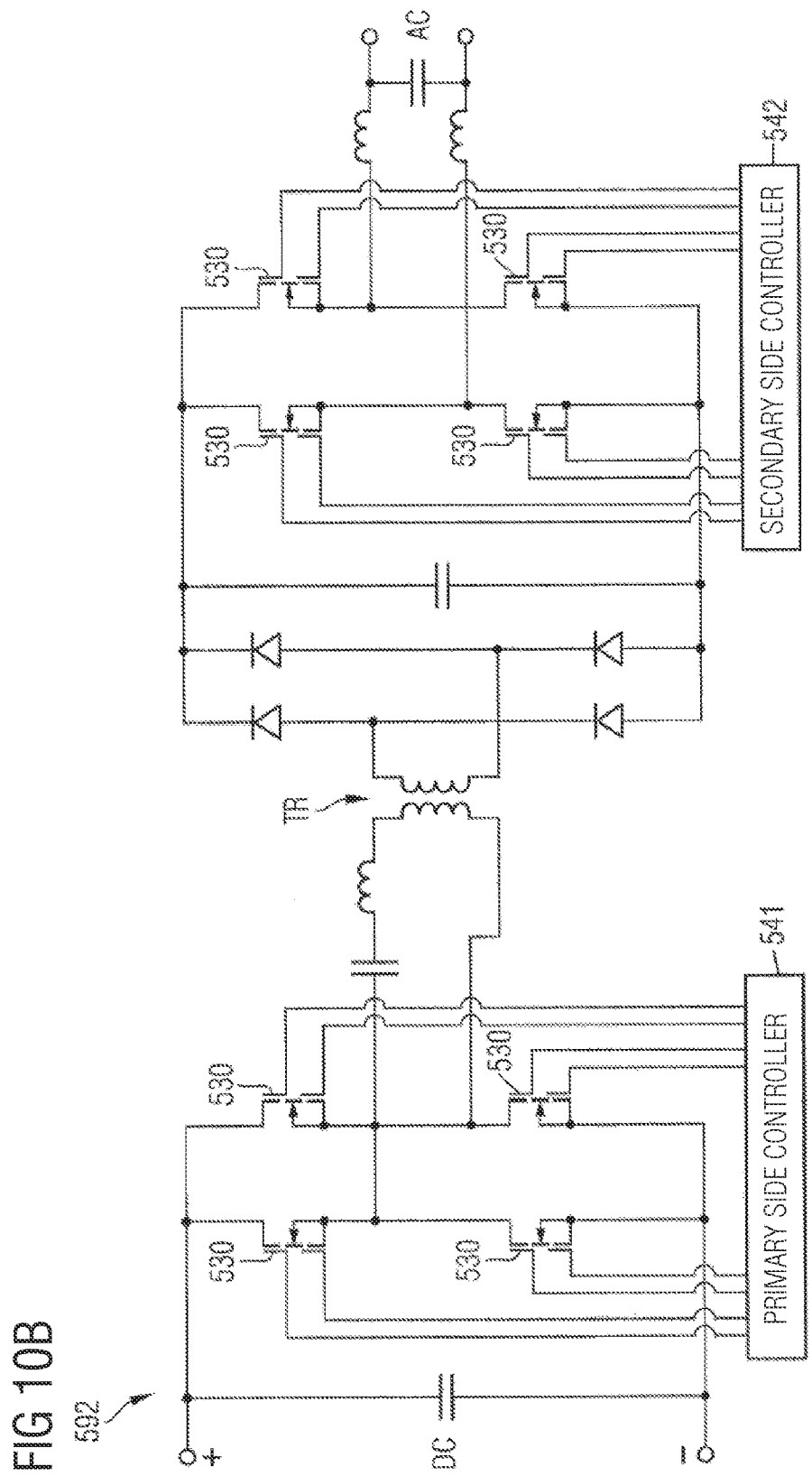

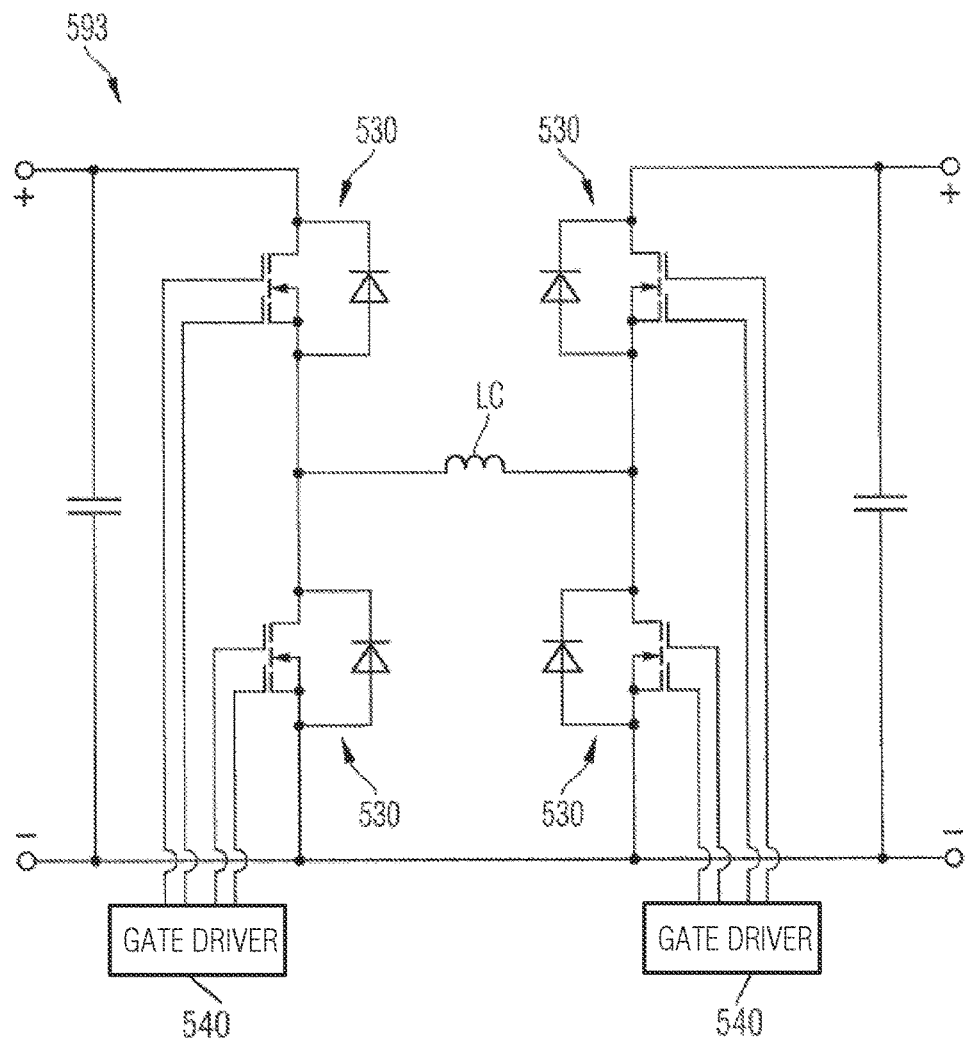

SWITCHED-MODE POWER CONVERTER WITH AN INDUCTIVE STORAGE ELEMENT AND A CASCODE CIRCUIT

BACKGROUND

In switched-mode power converters, energy is periodically stored typically in the magnetic field of an electric storage element and passed to a load during on-phases or off-phases of a pass transistor. The ratio of the on-time to the off-time of the pass transistor may be varied in response to changes of the load current at the input voltage, by way of example. Switched-mode power converters show higher conversion efficiency than linear power regulators. With higher switching frequencies of the power transistors, the size of the electric storage element shrinks.

It is desirable to improve conversion efficiency in switched-mode power converters.

SUMMARY

The object is achieved with subject-matter of the independent claims. The dependent claims refer to further embodiments.

According to an embodiment a switched-mode power converter includes an inductive storage element and a cascode circuit. The cascode circuit includes a double-gate field effect transistor. A switchable load path of the double-gate field effect transistor is electrically connected in series with the inductive storage element.

According to another embodiment a frequency mixer circuit includes a double-gate field effect transistor. A semiconductor portion of the double-gate field effect transistor includes a source zone, a drain region and a body zone. The body zone separates the source zone and the drain region and forms pn junctions with the source zone and the drain region. A first gate structure directly adjoins a first portion of the body zone and a second gate structure directly adjoins a second portion of the body zone. The first and second gate structures extend from a first surface of the semiconductor portion into the body zone.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 1 is a schematic circuit diagram of a switched-mode power converter with a cascode circuit including a double-gate field effect transistor according to an embodiment.

FIG. 3A is a schematic circuit diagram of a switched-mode power supply according to an embodiment referring to a forward converter supplying an output voltage galvanically separated from an input voltage.

FIG. 3B is a schematic circuit diagram of a switched-mode power supply according to an embodiment referring to a fly-back converter supplying an output voltage galvanically separated from an input voltage.

FIG. 9 is a schematic circuit diagram of an electronic assembly according to an embodiment related to switched mode power supplies and motor drives.

FIG. 10A is a schematic circuit diagram of an electronic assembly with cascode circuits including double-gate field effect transistors according to an embodiment related to switched mode power supplies.

FIG. 10B is a schematic circuit diagram of an electronic assembly with cascode circuits including double-gate field effect transistors according to an embodiment related to micro-inverters.

FIG. 10C is a schematic circuit diagram of an electronic assembly with cascode circuits including double-gate field effect transistors according to an embodiment related to DC-to-DC converters.

DETAILED DESCRIPTION

Figure 2A:
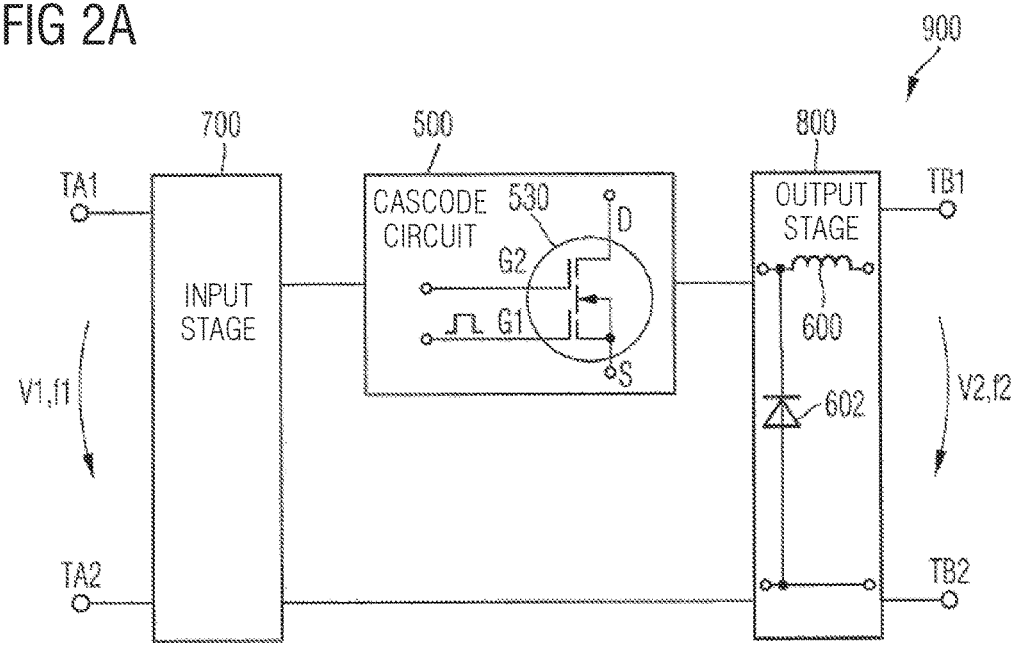
FIG. 2A is a schematic circuit diagram of a switched-mode power converter according to an embodiment concerning a non-isolating buck converter.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

FIG. 1 shows a switched-mode power converter 900. The switched-mode power converter 900 transforms an input voltage V1 applied between input terminals TA1, TA2 to an output voltage V2 between output terminals TB1, TB2. The input voltage V1 may be a DC (direct current) or an AC (alternating current) voltage and the output voltage V2 may be a DC or an AC voltage.

An input stage 700 electrically connected to the input terminals TA1, TA2 may include a rectifier circuit for rectifying an AC input voltage V1 and filter elements, by way of example. The output stage 800 electrically connected to the output terminals TB1, TB2 may include a rectifier circuit and/or filter elements. At least one of the input stage 700 and the output stage 800 includes an electric storage element 600. The output stage 800 further includes a switching element 602, e.g., a semiconductor diode or a semiconductor switch.

The electric storage element 600 temporarily stores energy in an on-phase or an off-phase of a cascode circuit 500. The storage element 600 may be an inductor, coil or transformer that stores energy in a magnetic field.

A cascode circuit 500 is galvanically coupled to the input stage 700 and turns on and off a current through the storage element 600. Depending on the topology of the switched-mode power converter 900, the storage element 600 supplies the load current through a load connected between the output terminals TB1, TB2 during the on phases or during the off phases of the cascode circuit 500.

The cascode circuit 500 includes a double-gate FET (field effect transistor) 530 which load path is electrically connected in series with the storage element 600 when the double gate FET 530 is on. The double-gate FET 530 includes a plurality of transistor cells electrically arranged in parallel, wherein a nominal maximum drain current $I_D$ may be at least 500 mA, e.g., at least 1 A.

The double-gate FET 530 includes a series connection of an amplifier stage 532 and a buffer stage 538. The amplifier stage 532 is controllable through a potential applied to a first gate terminal G1. The buffer stage 538 is electrically controllable through a potential applied to a second gate terminal G2. The amplifier stage 532 is directly connected to a source terminal S of the double-gate FET 530. The buffer stage 538 is directly electrically connected to a drain terminal D. One of the source and drain terminals D, S is electrically connected to the storage element 600.

The amplifier stage 532 turns on and off the load current through the storage element 600 at a high current amplification factor (gain)/low voltage gain due to that the drain potential is fixed by the buffer stage 538. The Miller effect is reduced proportional to voltage gain reduction. The buffer stage 538 has a current gain of about 1 but shields the amplifier stage 532 against the drain potential variations such that the amplifier stage 532 has only a low Miller effect due to its gate drain capacitance Cgd. As a result, switching can be processed fast and resulting switching losses are low.

During the transition between the off-state and the on-state the initial gate drain capacitance Cgd of a single-gate FET in the off-state increases to a value Cgd×k, wherein k is the gain of the single-gate FET. With the buffer stage 538 formed between the drain and the amplifier stage 532, the drain gate capacitance Cgd of the amplifier stage 532 is low. On the other hand, though the gate drain capacitance Cgd of the buffer stage 538 may be comparatively high, the low gain of the buffer stage 538 ensures that also for the buffer stage 538 the resulting Miller capacity is comparatively low. Integrating the cascode configuration into a single semiconductor die such that the buffer stage 538 is not only electrically but also physically between a drain electrode and the amplifier stage 532 with respect to a virtual direct connection line between the drain electrode and a gate structure of the amplifier stage 532 significantly reduces the Miller effect for the double-gate FET according to the embodiments.

A coupling 901 between the input stage 700 and the cascode circuit 500 on the one hand and the output stage 800 on the other hand may be a wiring connection or may be magnetic coupling through the magnetic field of a transformer. Accordingly, the output voltage V2 is or is not galvanically separated from the input voltage V1. The output voltage V2 may have the same or the opposite polarity as the input voltage V1.

The switched-mode power converter 900 may be a DC/DC converter with $f_1=0$, $f_2=0$, a DC/AC converter with $f_1=0$, $f_2\neq 0$, an AC/DC converter with $f_1\neq 0$, $f_2=0$ or an AC/AC converter with $f_1\neq 0$, $f_2\neq 0$, wherein the underlying topology may be a buck converter with an output voltage V2 lower than or equal to the input voltage V1 or a boost converter with the output voltage equal to or greater than the input voltage V1 or a combination of elements of both.

Figure 2B:
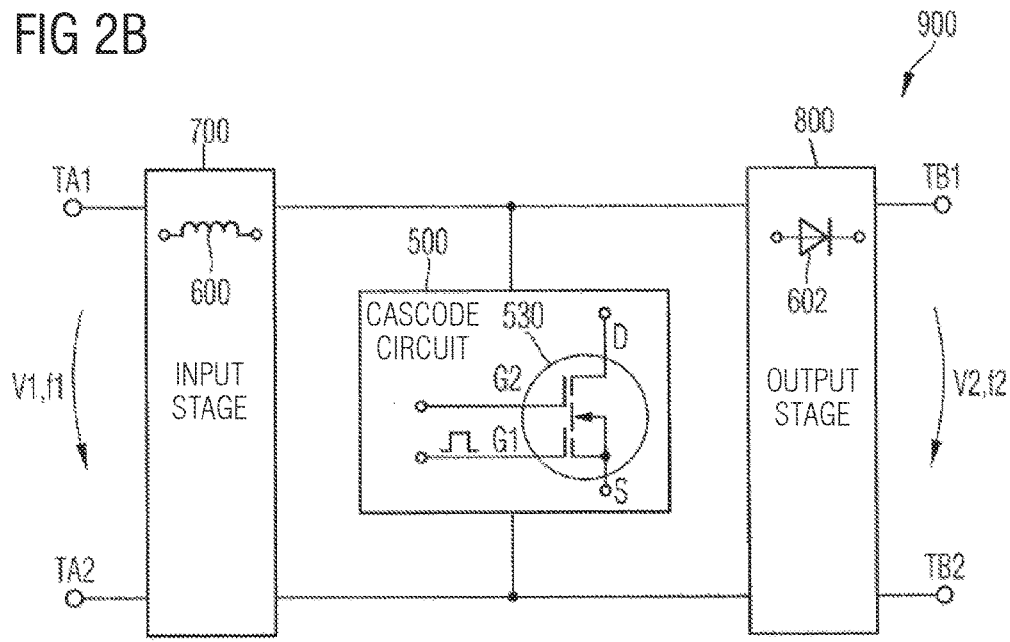
FIG. 2B is a schematic circuit diagram of a switched-mode power converter according to an embodiment concerning a non-isolating boost converter.

FIGS. 2A and 2B refer to non-isolating switched-mode power converters 900. In FIG. 2A the power converter 900 is a buck converter with the inductive storage element 600 and a switching element 602, for example, a semiconductor diode placed in the output stage 800.

In the on-state of the cascode circuit 500 a current flows through the inductive storage element 600 and through a load connected between the output terminals TB1, TB2. The inductive storage element 600 stores energy in its magnetic field. When the cascode circuit 500 turns off, the magnetic field in the storage element 600 supplies a load current through a load connected between the output terminals TB1, TB2 and the switching element 602.

The power converter 900 of FIG. 2B is a boost converter with an inductive storage element 600 in the input stage 700 and a further switching element 602, for example, a semiconductor diode in the output stage 800. The inductive storage element 600 stores energy in its magnetic field, when the cascode circuit 500 is on. When the cascode circuit 500 turns off, the storage element 600 supplies a load current for a load connected between the output terminals TB1, TB2 through the switching element 602.

FIGS. 3A to 3B refer to power converters 900 based on converter topologies that provide a galvanic separation between the load connected at the output terminals TB1, TB2 and the input stage 700.

FIG. 3A shows a forward converter. The output stage 800 may include a transformer 815 with a primary winding 811 electrically connected with the cascode circuit 500 and the input stage 700 and the secondary winding 812 electrically connected with an inductive storage element 600 in the output stage 800. The mode of operation of the forward converter is similar to that of the buck converter in FIG. 2A, apart from that the cascode circuit 500 turns on and off the load current through the inductive storage element 600 through the transformer 815.

In FIG. 3B the power converter 900 is a fly-back converter based on the boost topology of FIG. 2B. The storage element 600 in the input stage 700 is replaced with a transformer 715 which primary winding 711 is electrically connected to the cascode circuit 500 and which secondary winding 712 is part of the output stage 800 that includes a switching element 602, for example, a semiconductor diode through which the load current flows when the cascode circuit 500 is in the off state.

Figure 4A:
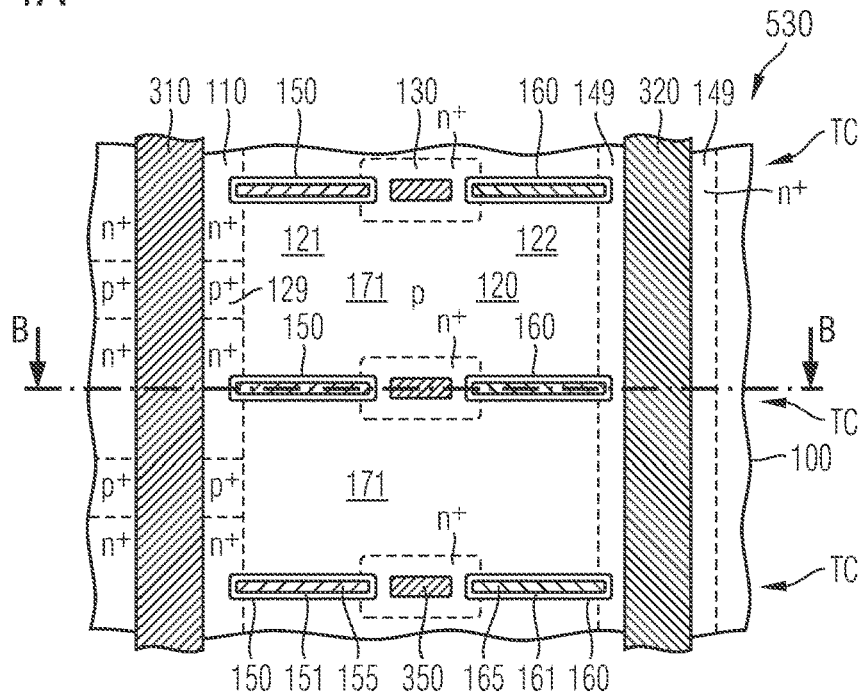
FIG. 4A is a schematic vertical cross-sectional view of a portion of a lateral double-gate field effect transistor according to an embodiment with laterally arranged amplifier and buffer stage.
Figure 4B:
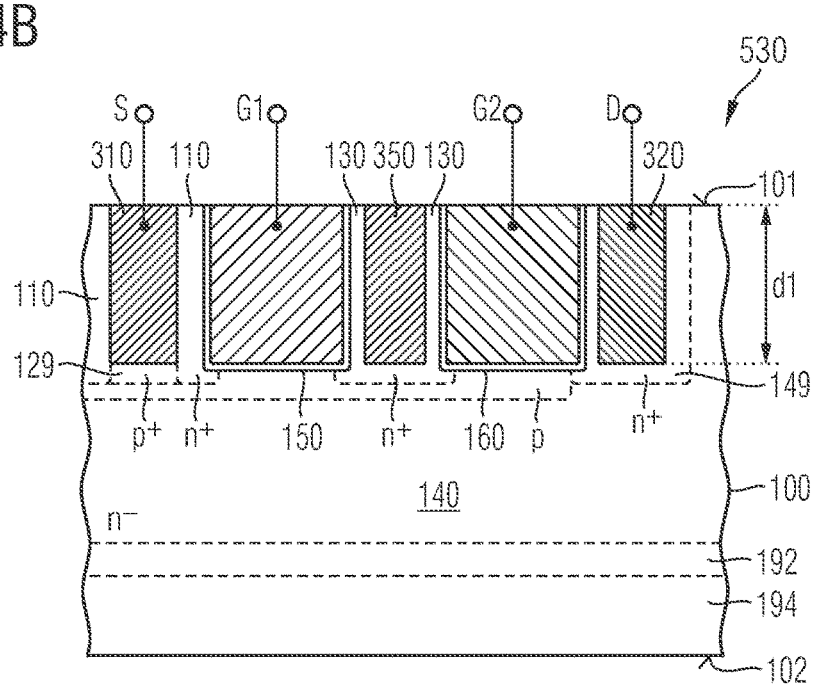
FIG. 4B is a schematic horizontal cross-sectional view of the semiconductor device portion of FIG. 3A along line B-B.

FIGS. 4A and 4B refer to an embodiment with the integrated double-gate FET 530 including a plurality of transistor cells TC electrically arranged in parallel to each other, wherein the transistor cells TC are FinFET (fin field effect transistor) cells.

A semiconductor portion 100 of the double-gate FET 530 is based on a crystalline semiconductor material, for example, a single crystalline silicon Si, silicon carbide SiC, germanium Ge, a silicon germanium crystal SiGe or an $A_{III}B_V$ compound semiconductor. A first surface 101 and an opposite second surface 102 of the semiconductor portion 100 are parallel to each other. Directions parallel to the first surface 101 are lateral directions and a normal to the first surface 101 defines a vertical direction.

The semiconductor portion 100 may include a base layer 194 directly adjoining the second surface 102. The base layer 194 may be or may include a dielectric layer, for example a silicon oxide layer or a glass layer. According to an embodiment, the base layer 194 may be or may include a lightly n-doped semiconductor layer. According to other embodiments, the base layer 194 may be absent. According to an embodiment, a metal-containing shielding layer may directly adjoin the second surface 102.

The semiconductor portion 100 further includes a lightly doped semiconductor layer 140, which may be an epitaxial grown layer. The semiconductor layer 140 may have a background doping of the n-type and further semiconducting regions may be formed by implanting and diffusing dopants into portions of the semiconductor layer 140.

The transistor cells TC include first gate structures 150 arranged between first semiconductor fins 171 formed from protruding sections of the semiconductor portion 100 between the first gate structures 150. The first gate structures 150 extend from a plane spanned by the first surface 101 at a front side into the semiconductor portion 100 down to a plane at a first distance d1 to the first surface 101. Lateral longitudinal axes of the first gate structures 150 are parallel to a first lateral direction.

The first gate structures 150 may be regularly arranged adjacent to each other in a column extending along a second lateral direction perpendicular to the first lateral direction at a regular center-to-center distance (pitch). The pitch of the first gate structures 150 may be between 50 nm and 1000 nm, e.g., between 100 nm and 250 nm. A width of the first gate structures 150 along the second lateral direction may be between 50 nm and 200 nm, by way of example. The first gate structures 150 include a conductive first gate electrode 155. A gate wiring from the same material may run along the second lateral direction above the first surface 101 and may connect portions of the first gate electrode 155.

The first gate structures 150 further include a first gate dielectric 151 separating the first gate electrode 155 at least from body zones 120 formed in portions of the first semiconductor fins 171. The first gate dielectric 151 may completely insulate the first gate electrodes 155 from the semiconductor portion 100. According to another embodiment, further insulator structures, which differ from the first dielectric 151 in at least one of composition and thickness, may be formed along end faces of the first gate structures 150 as well as along the bottom portion.

The transistor cells TC further include second gate structures 160, which may be formed in a projection of the first gate structures 150 into the first lateral direction on opposite sides of the first semiconductor fins 171. The second gate structures 160 may have the same lateral dimensions as the first gate structures 150 or may be longer or shorter, or narrower or wider. The second gate structures 160 may be regularly arranged adjacent to each other in a column extending along the second lateral direction and at a regular pitch. The pitch of the second gate structures 160 may be the same as the pitch of the first gate structures 150.

Each second gate structure 160 includes a portion of a conductive second gate electrode 165. A second gate wiring line above the first surface 101 may run along the second lateral direction and may connect the portions of the second gate electrode 160. The second gate structures 160 include a second gate dielectric 161 separating the second gate electrode 165 at least from the body zone 120. The second gate dielectric 161 may completely insulate the second gate electrode 165 from the semiconductor portion 100. According to other embodiments, further insulator structures, which differ from the second gate dielectrics 161 in at least one of composition and thickness may be formed at least at one end face of the second gate structures 160 and/or along the ground plane.

The first and second gate electrodes 155, 165 may be formed from the same or from different conductive materials. According to an embodiment, the first and second gate electrodes 155, 165 may consist of or may contain a portion of heavily doped polycrystalline silicon. According to other embodiments, the first and second gate electrodes 155, 165 may include a metal-containing portion, e.g., a metal silicide layer, a layer containing titanium or tantalum, and/or a layer containing tungsten W, aluminum Al or copper Cu, by way of example.

The first and second gate dielectrics 151, 161 may differ as regards configuration, material composition and thickness or may be provided from the same materials in the same configuration at the same thickness. Each of the first and second gate dielectrics 151, 161 or both may consist of or contain a semiconductor oxide layer, e.g., a thermally grown silicon oxide, a deposited silicon oxide layer, for example a silicon oxide using TEOS (tetraethylorthosilicate) as precursor material, a silicon nitride layer or a silicon oxynitride layer.

A source contact stripe 310 with a longitudinal axis parallel to the second lateral direction may extend from a plane spanned by the first surface 101 into the semiconductor portion 100 at a side of the first gate structures 150 opposite to the second gate structures 160. A drain contact stripe 320 with a longitudinal axis parallel to the second lateral direction may extend from the plane spanned by the first surface 101 into the semiconductor portion 100 at a side of the second gate structures 160 opposite to the first gate structures 150.

The source and drain contact stripes 310, 320 may have the same configuration. For example, the source and drain contact stripes 310, 320 include a barrier liner directly adjoining the semiconductor portion 100. The barrier liner may have a thickness of 1 nm to 50 nm and may consist of or contain a silicide, cobalt Co, titanium Ti, titanium nitride TiN, tantalum Ta, or tantalum nitride TaN, by way of example. The source and drain contact stripes 310, 320 may also include a fill portion filling the cross-sectional area of the respective contact stripe and separated from the semiconductor portion 100 by the barrier liner. The material of the fill portion may be tungsten W, by way of example. According to other embodiments, the source and drain contact stripes 310, 320 may include a layer of heavily doped polycrystalline silicon and/or a metal-containing layer, for example a silicide.

Each semiconductor fin 171 may include a body zone 120, which may be p-doped for an n-channel double-gate FET 530. The body zone 120 may form a pn junction with a heavily n-doped drain zone 149 directly adjoining and forming an ohmic contact with the drain contact stripe 320. The body zones 120 may form further pn junctions with source zones 110 directly adjoining and forming ohmic contacts with the source contact stripes 310.

Heavily p-doped contact zones 129 may electrically connect the body zones 120 with the source contact stripes 310. A vertical extension of the body zones 120 may be greater than the vertical extension of the first and second gate structures 150, 160 such that body zones 120 of semiconductor fins 171 neighboring to each other along the second lateral direction are connected to each other.

A heavily n-doped connection zone 130 is formed between each pair of first and second gate electrodes 150, 160. The connection zones 130 of neighboring pairs of first and second gate structures 150, 160 along the second lateral direction may be separated from each other.

The source zones 110 and the connection zones 130 overlap with end portions of the first gate electrode 155 and first portions 121 of the body zones 120 separate them from each other.

The drain zone 149 and the connection zones 130 overlap opposite end portions of the second gate structures 160 and second portions 122 of the body zones 120 separate the drain zone 149 from the connection zones 130.

If a sufficiently high positive potential is applied to the first gate electrode 155, an inversion channel forms along the first gate dielectric 151 and connects the source zone 110 with the connection zone 130. If a sufficiently high positive voltage is applied to the second gate electrode 160 an inversion channel is formed between the connection zone 130 and the drain zone 149 along the second gate dielectric 161.

Connection plugs 350 may extend from the first surface 101 into the semiconductor layer 140 and may decrease an effective resistance between the inversion channels formed along the first and second gate structures 150, 160.

The second gate structures 160 shield to some degree the first gate structures 150 against the potential applied to the drain contact stripe 320 such that the effective Miller charge of the double-gate FET 530 is low compared to corresponding single-gate FETs.

When a distance w1 between neighboring first gate structures 150 is equal to or smaller than twice a boundary width $l_d$, i.e., for $w1 \leq 2*l_d$, the body zones 120 are fully depleted when the semiconductor device 500 is on. In a fully depletable body zone 120, short channel effects resulting from a remaining impact of the drain potential on the charge carrier distribution in the body zone 120 are further suppressed.

The boundary width $l_d$ depends on material characteristics and temperature. Equation (1) defines the boundary width $l_d$ as a function of material characteristics, temperature and of the dopant concentration in the body zone 120.

$$l_d = \sqrt{\frac{4\varepsilon_s kT \ln(N_A/n_i)}{q^2 N_A}} \quad (1)$$

In equation (1), $\varepsilon_s$ is the permittivity of the semiconductor material (11.9×$\varepsilon_0$ for silicon, $\varepsilon_0$=8.85×10$^{-14}$ F/cm), k is the Boltzmann constant (1.38066×10$^{-23}$ J/K), T is the thermodynamic temperature (e.g. 300 K), ln is the natural logarithm, $N_A$ is the dopant concentration in the body zone 120, $n_i$ is the intrinsic carrier concentration (1.45×10$^{10}$ cm$^{-3}$ for silicon at the thermodynamic temperature T), and q denotes the elementary charge (1.6×10$^{-19}$ C).

Figure 5A:
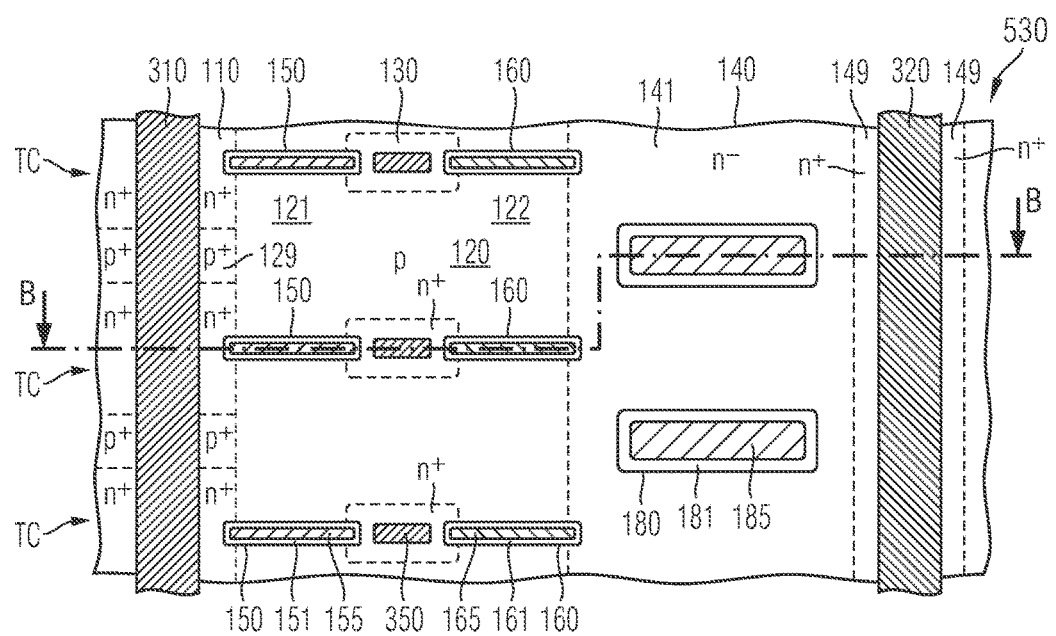
FIG. 5A is a schematic vertical cross-sectional view of a portion of a lateral double-gate field effect transistor according to an embodiment including field plate structures.
Figure 5B:
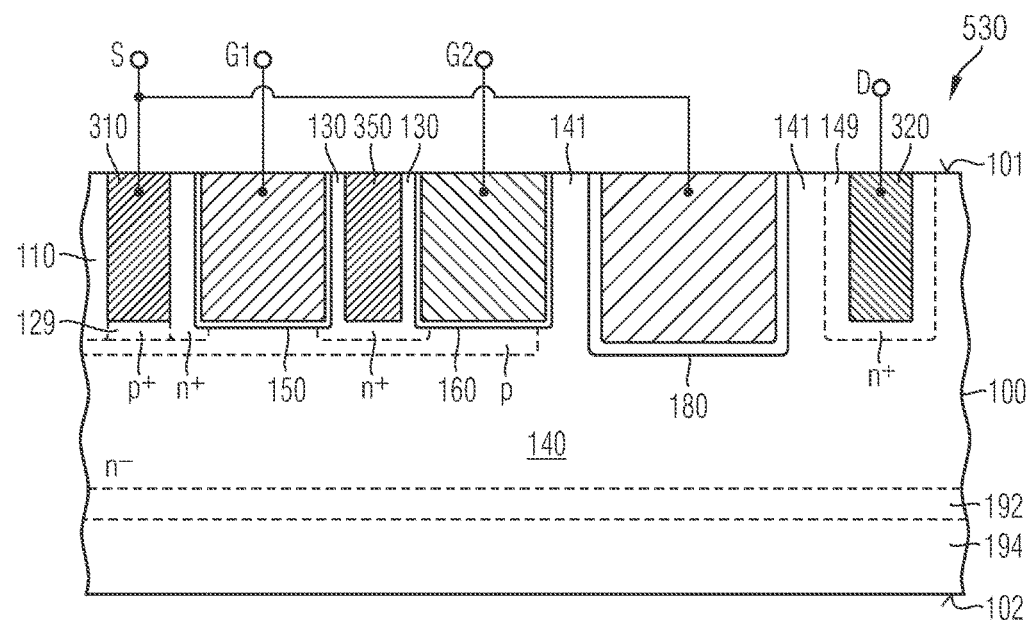
FIG. 5B is a schematic horizontal cross-sectional view of the semiconductor device portion of FIG. 5A along line B-B.

The semiconductor device 500 of FIGS. 5A and 5B includes field plate structures 180 arranged along the second lateral direction between the second gate structures 160 and the drain contact stripe 320.

Vertical and lateral dimensions of the field plate structures 180 may be the same as that of at least one of the first and second gate structures 150, 160 or may be greater. A pitch of the field plate structures 180 may be the pitch of the first and second gate structures 150, 160 or may be greater. The pitch of the field plate structures 180 may be an integer multiple of the pitch of the first and second gate structures 150, 160. The field plate structures 180 may extend from the first surface 101 into a weakly doped drift zone 141 between the body zones 120 and the drain zone 149. The weakly doped drift zone 141 may contain the same dopants and may have the same dopant concentration as the semiconductor layer 140

The field plate structures 180 include a field electrode 185 and a field dielectric 181 separating the field electrode 185 from the drift zone 141. The field electrode 185 may consist of or may contain a portion of heavily doped polycrystalline silicon or may consist of a metal-containing portion, e.g. a metal silicide layer, a layer containing Ti, Ta, and/or a layer containing W, Al, Cu, by way of example. The field electrode 185 may be electrically connected to a source electrode, to a potential between the source and drain potentials, or may float.

The field dielectric 181 may be thicker than the first and second gate dielectrics 151, 161 and may consist of or may contain a semiconductor oxide layer, e.g., a thermally grown silicon oxide, a deposited silicon oxide layer, for example a silicon oxide using TEOS as precursor material, a silicon nitride layer, or a silicon oxynitride layer.

In the blocking mode the field plate structures 180 may deplete intermediate portions of the drift zone 141 such that the semiconductor device 500 has a high blocking capability at comparatively low resistance of the drift zone 141. A longitudinal center axis of at least one of the source contact stripe 310 and the drain contact stripe 320 may be a symmetry axis, such that transistor cells TC on opposite sides of the source contact stripe 310 share the same source contact and transistor cells TC on opposite sides of the drain contact stripe 320 share the same drain contact.

Figure 6:
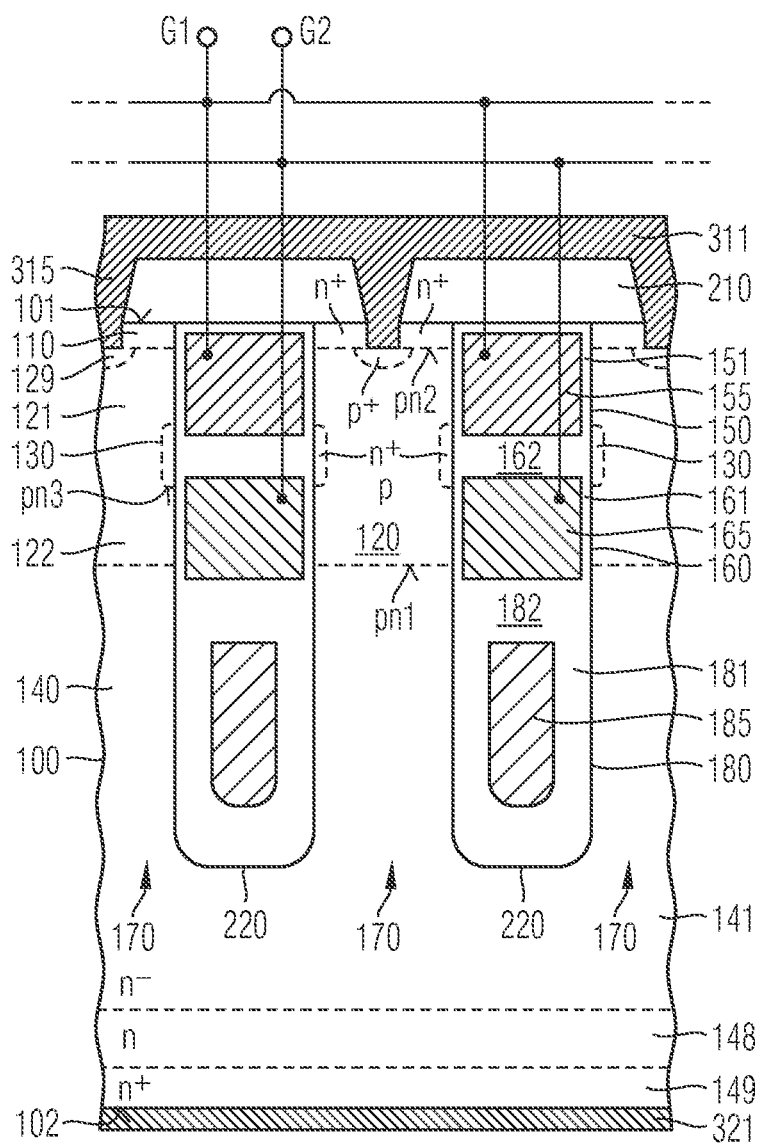
FIG. 6 is schematic vertical cross-sectional view of a portion of a vertical double-gate field effect transistor according to an embodiment with vertically arranged amplifier and buffer stage.

FIG. 6 refers to a vertical double-gate transistor cell with the first and second gate electrodes 150, 160 and the field plate structure 180 formed vertically stacked and separated from each other in trench structures 220 extending from a first surface 101 into a drift zone 141. A source electrode 311 may be formed at a front side of the semiconductor portion 100 defined by the first surface 101 and a drain electrode 321 along a second surface 102 on the back.

The drain zone 149 may be formed along the second surface 102 and a field stop zone 148 with a higher dopant concentration than the drift zone 141 and a lower dopant concentration than the drain zone 149 may be formed between the drift zone 141 and the drain zone 149. Body zones 120 are formed in semiconductor fins 171 between neighboring trench structures 220. The body zones 120 form first pn junctions pn1 with the drift zone 141 and second pn junctions pn2 with the source zones 110 that may be formed between the first surface 101 and the body zones 120. An interlayer dielectric 210 may be formed on the first surface 101 in the vertical projection of the trench structures 220. Source contacts 315 extending from the source electrode 311 through openings in the interlayer dielectric 210 to or into the semiconductor fins 170 may electrically connect the source electrode 311 with the source zones 110 and, through heavily doped contact zones 129 the body zones 120. Within the trench structures 220 a gate separation 162 may separate the first and the second gate electrodes 155, 165 and a field separation 182 may separate the field electrode 185 from the second gate electrode 165.

Connection zones 130 forming third pn junction pn3 with the body zones 120 extend in the semiconductor fins 170 along sidewall portions of the trench structures 220 and overlap with the gate separations 162. In the on-state, inversion channels are formed between the source zones 110 and the connection zones 130 as well as between the connection zones 130 and the drift zone 141 through the body zones 120 along the first and second gate dielectrics 151, 161. The second gate structures 160 as well as the field plate structures 180 reduce the capacitive coupling between the first gate electrode 150 and the drain electrode 321.

Figure 7A:
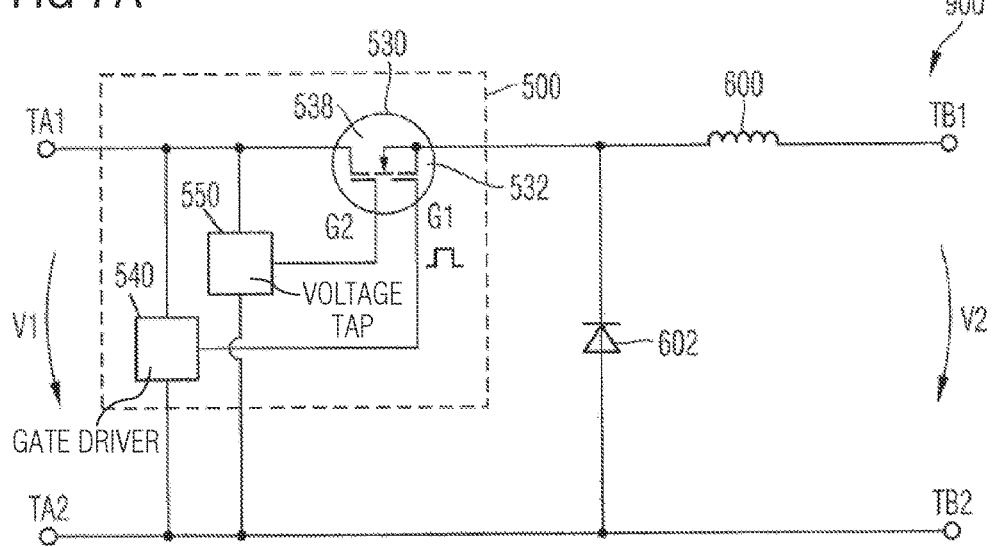
FIG. 7A is a schematic circuit diagram of a buck converter according to an embodiment with a cascode circuit including a double-gate field effect transistor and with a semiconductor diode.

FIG. 7A refers to a power converter 900 based on the buck topology of FIG. 2A. In this case the switching element 602 in the output stage 800 is a semiconductor diode that is reverse-biased when the cascode circuit is on and that is forward-biased when the cascode circuit 500 is off. The cascode circuit 500 further includes a gate driver circuit 540 that outputs a control signal for alternatingly turning on and off the amplifier stage 532 of the double-gate field effect transistor 530 through a signal applied to the first gate terminal G1. The gate driver circuit 540 may be or may include an oscillator circuit, which frequency and/or duty cycle may be controlled in response to a change of the input voltage and/or the load current. The gate driver circuit 540 may include one or more control inputs and one or more sense inputs for inputting signals containing information about the input voltage V1 and/or the output voltage V2. The gate driver circuit 540 may be a gate driver similar to a gate driver used for single-gate IGFETs in similar applications.

The cascode circuit 500 may further include a voltage tapping circuit 550 connected to the second gate terminal G2 of the double-gate FET 530 to control the buffer stage 538.

The voltage tapping circuit 550 may supply a fixed voltage or a voltage that may change between at least two levels in response to a further control signal. The voltage tapping circuit 550 may be a high-impedance voltage divider including a network of resistors, a charge pump, a voltage regulator or a transistor circuit for applying at least two different voltages to the second gate terminal G2 of the double gate FET 530. According to an embodiment, the voltage tapping circuit 550 gradually increases the voltage level at the second gate terminal G2 with increasing output voltage V2.

Figure 7B:
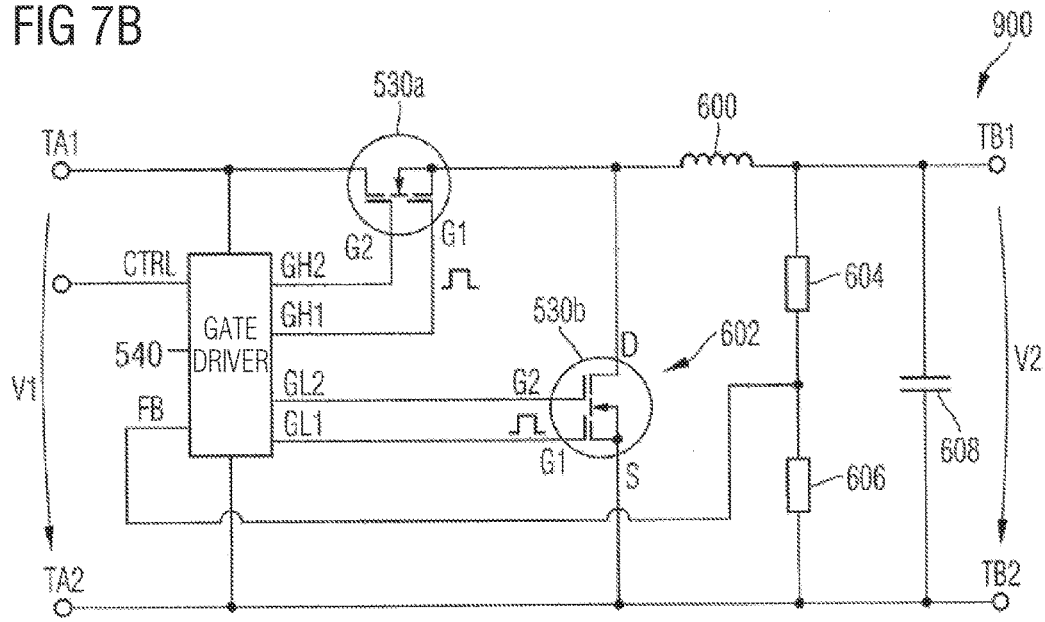
FIG. 7B is a schematic circuit diagram of a buck converter according to an embodiment with a cascode circuit including two double-gate field effect transistors.

The power converter 900 of FIG. 7B includes a first double gate FET 530a as pass switch for turning on and off a current through the storage element 600 and a second double gate FET 530b as switching element 602 that is off when the first double-gate FET 530a is on and that is on when the first double-gate FET 530a is off.

The gate driver circuit 540 may integrate the functionality of the voltage tapping circuit 550 of FIG. 7A for both the first and the second double gate field effect transistors 530a, 530b. A control input CTRL of the gate driver circuit 540 may be used to shut down the power converter 900. A feedback pin FB may provide information about the amplitude of the output voltage V2 by using a voltage divider with resistors 604, 606 electrically connected in series between the first and second output terminals TB1, TB2. A capacitance 608 may smooth the output voltage V2.

The low Miller charge $Q_{gd}$ that is effective for the double-gate FETs 530a, 530b allows high switching frequencies for the first double-gate FET 530a. During switching the gate driver circuit 540 has to provide less charge per time period. The gate driver circuit 540 therefore operates more efficient and dissipates less energy, such that the chip area of the gate driver circuit 540 may be smaller than for other transistors used as pass switch in the same configuration.

Using the second double-gate FET 530b instead of a semiconductor diode as switching element 602 further reduces switching losses, because the on-state losses of a transistor are generally lower than the forward losses of a semiconductor diode.

The lower Miller charge $Q_{gd}$ of the second double-gate FET 530b may simplify to keep the second double-gate FET 530b in the off-state when the first double-gate FET 530a is turned on, because a higher Miller charge may result in an unintentional turn-on triggered by voltage spikes across the gate drain capacitance. When the condition that both double-gate FETs 530a, 530b are both turned on for a certain overlap time can be excluded by reducing the Miller charge, the threshold voltage of the second double-gate FET 530b may be reduced. The reduced threshold voltage reduces the gate driver voltage and the gate charge for turning the device on. The reduced gate charge reduces energy dissipation in the gate driver circuit 540 and results in higher efficiency of the gate driver circuit 540, which may in turn be used to further reduce the chip area.

Figure 8A:
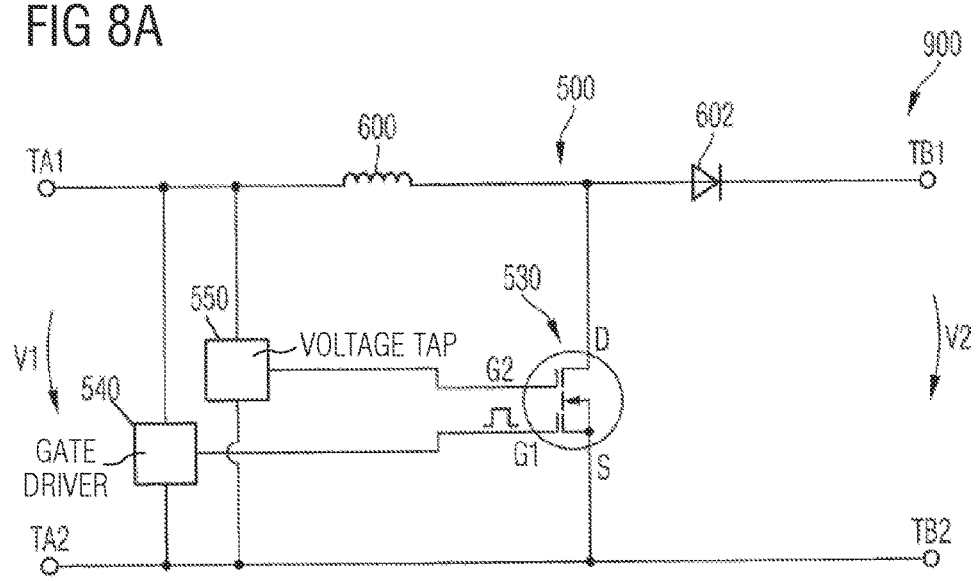
FIG. 8A is a schematic circuit diagram of a boost converter according to an embodiment with a cascode circuit including a double-gate field effect transistor and with a semiconductor diode.
Figure 8B:
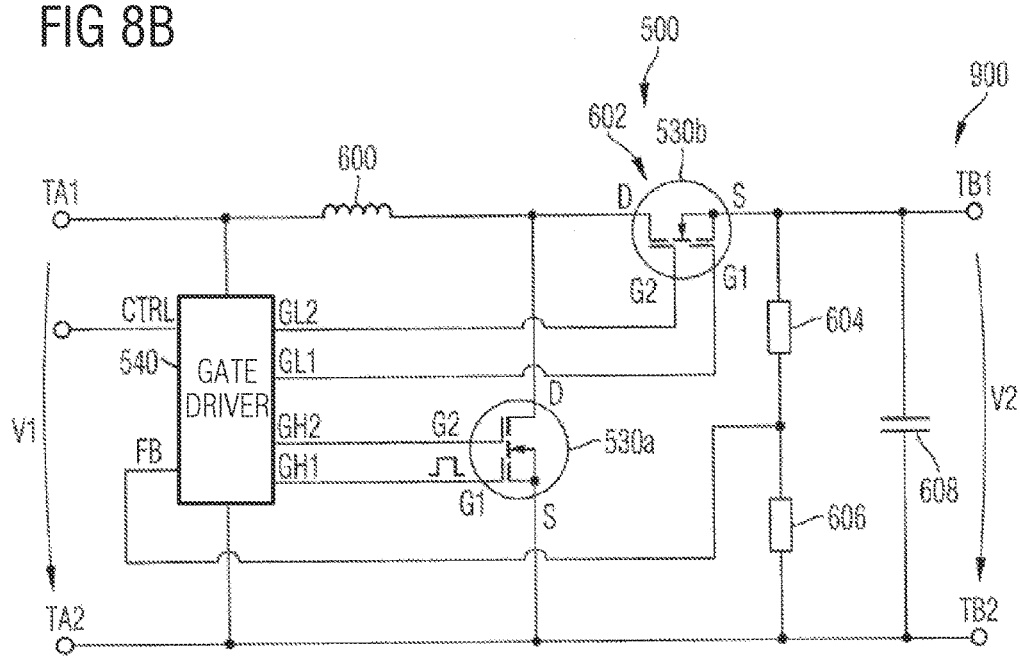
FIG. 8B is a schematic circuit diagram of a boost converter according to an embodiment with a cascode circuit including two double-gate field effect transistors.

The power converters 900 in FIGS. 8A and 8B are corresponding embodiments of the boost topology as illustrated in FIG. 2B.

FIG. 9 refers to an electronic assembly 950 that may be a motor drive, a switched mode power converter, a primary stage of a switched mode power supply, a synchronous rectifier, a primary stage of a DC-to-AC converter, a secondary stage of a DC-to-AC converter, a primary stage of a DC-to-DC converter, or a portion of a solar power converter, by way of example.

The electronic assembly 950 may include two identical double-gate FETs 530 as described above. The double-gate FETs 530 may be lateral double-gate FinFETs or double-gate vertical FETs. The load paths of the two double-gate FETs 530 are electrically arranged in series between a first supply terminal A and a second supply terminal B. The supply terminals A, B may supply a DC (direct-current) voltage or an AC (alternating-current) voltage. The network node NN between the two semiconductor devices 500 may be electrically connected to an inductive load, which may be a winding of a transformer or a motor winding, or to a reference potential of an electronic circuit, by way of example. The electronic assembly 950 may further include a control circuit 504 configured to supply control signals for alternately turning on and off the double-gate FETs 530 as well as a gate driver 502 controlled by the control circuit 504 and electrically connected to the first gate terminals G1 and to the second gate terminals G2 of the double-gate FETs 530.

The electronic assembly 950 may be a motor drive with the double-gate FETs 530 electrically arranged in a half-bridge configuration, the network node NN electrically connected to a motor winding and the supply terminals A, B supplying a DC voltage.

According to another embodiment, the double-gate FETs 530 may be a primary side stage of a switched mode power supply with the supply terminals A, B supplying an AC voltage of an input frequency to the electronic assembly 950, wherein the network node NN is electrically connected to a primary winding of a transformer.

The electronic assembly 950 may be a synchronous rectifier of a switched mode power supply with the supply terminals A, B connected to a secondary winding of the transformer and the network node NN electrically connected to a reference potential of the electronic circuit at the secondary side of the switched mode power supply.

According to a further embodiment, the electronic assembly 950 may be a primary side stage of a DC-to-DC converter, e.g., a power optimizer or a micro-inverter for applications including photovoltaic cells with the supply terminals A, B supplying a DC voltage to the electronic assembly 510 and the network node NN electrically connected to an inductive storage element.

According to another embodiment, the electronic assembly 950 may be a secondary side stage of a DC-to-DC converter, e.g., a power optimizer or a micro-inverter for applications including photovoltaic cells, wherein the electronic assembly 950 supplies an output voltage to the supply terminals A, B and wherein the network node NN is electrically connected to the inductive storage element.

FIG. 10A refers to a switched mode power converter 900 using double-gate FETs 530 as described above in a primary side stage 511 as well as in a synchronous rectifier 512 at the secondary side.

AC supply voltage is supplied to the primary side stage through a power factor correction unit 513. A pulse width modulation controller 521 controls a gate driver 522 such that two double-gate FETs 530 electrically arranged in series in the primary side stage are alternatively switched on and off. The network node NN between the load paths of the two double-gate FETs 530 is electrically connected to the primary winding of a transformer TR. In the synchronous rectifier 512 at the secondary side, two further double-gate FETs 530 may be electrically arranged in series with respect to each other and, in combination, electrically arranged in parallel to the secondary winding of the transformer TR. Secondary gate drivers 523 alternatingly switch on and off the double-gate FETs 530 of the synchronous rectifier 512. A coupling element 525 that may provide galvanic insulation feeds back the output signal of the synchronous rectifier 512 to the pulse width modulation controller 521 that adjusts the timing of the switching cycles in response to varying load conditions.

The low output capacity of the double-gate FETs 530 significantly improves the degree of efficiency of the power conversion, for example in an operation mode with only a light load at the output of the switched mode power converter 900.

The solar micro-inverter 592 of FIG. 10B includes, at a primary side of a transformer TR, two branches with in each case two double-gate FETs 530 used as switches and electrically arranged in a full-bridge-like configuration as regards a primary winding of the transformer TR. A primary side controller unit 541 drives appropriate gate signals for the four double-gate FETs 530 at the primary side to transform the input DC voltage to an intermediate high-frequency AC. A similar arrangement at the secondary side with a secondary side controller unit 542 and further four double-gate FETs 530 used as switches and arranged in a full-bridge-like configuration as regards the output terminals transform the rectified voltage at the secondary stage into an AC voltage of a specified output frequency.

The input DC terminals may be electrically connected to output terminals of a solar panel including photovoltaic cells and the micro-inverter 592 may convert the DC output voltage of the solar panel into an appropriate AC voltage, e.g., 235V at 50 Hz. The low Miller charge of the double-gate FETs 530 significantly reduces switching losses.

FIG. 10C refers to DC-to-DC converter 593, e.g., a power optimizer for solar cells that uses a coil LC as an inductive storage element. The DC-to-DC converter 593 may be a power optimizer for applications concerning photovoltaic cells and may be a hard switching converter where a reduction of the Miller charge $Q_{gd}$ may significantly improve conversion efficiency.

Figure 11A:
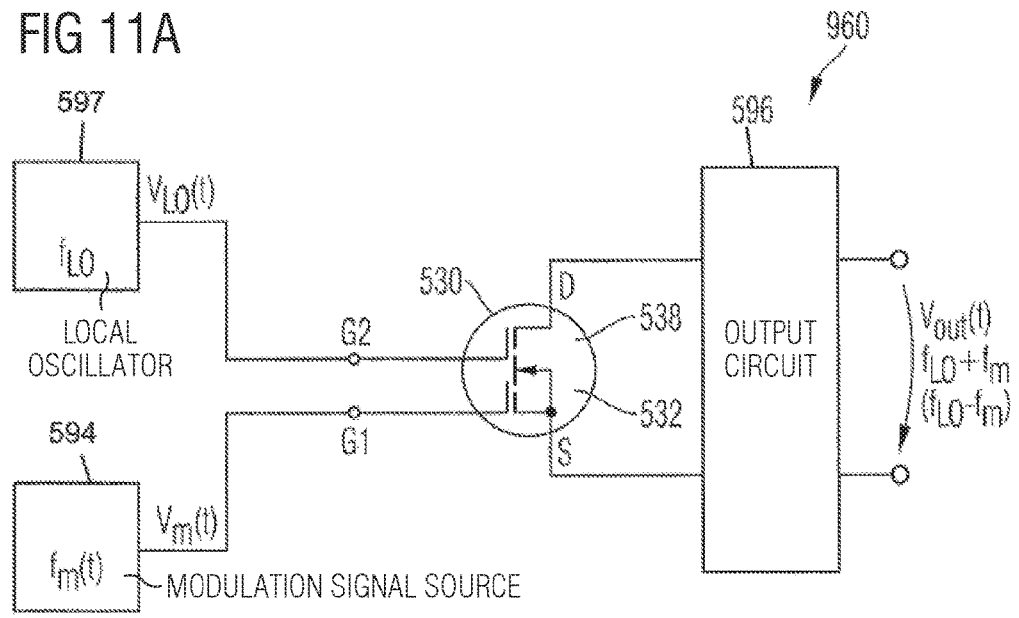
FIG. 11A is a schematic circuit diagram of a frequency mixer circuit including a double-gate field effect transistor with gate structures extending from a first surface into a semiconductor portion according to an embodiment.

FIG. 11A shows a frequency mixer circuit 960 for up shifting or down shifting the frequency of signals, e.g., in the context of signal transmission. A modulation signal source 594 feeds a modulation signal $V_m(t)$ including information encoded in amplitude, phase or frequency of the modulation signal $V_m(t)$ to a first gate terminal G1 of a dual-gate FET 530 as described above. The modulation signal source 594 may be any type of encoder encoding information in amplitude, phase or frequency of the modulation signal $V_m(t)$ or may be a receiver circuit receiving a modulated receive signal, e.g., a radio signal.

A local oscillator unit 597 feeds a local oscillator signal $V_{LO}(t)$ of an approximately constant local oscillator frequency $f_{LO}$ to a second gate terminal G2 of the dual-gate FET 530. The dual-gate FET 530 multiplies the modulation signal $V_m(t)$ and the local oscillator signal $V_{LO}(t)$ such that the resulting output signal $V_{out}(t)$ tapped at the output circuit 596 contains the heterodynes, i.e., signal portions at the sum and at the difference of the frequencies of $V_{LO}(t)$ and $V_m(t)$.

The double-gate FET 530 includes a series connection of an amplifier stage 532 and a buffer stage 538, wherein the amplifier stage 532 is controllable through a potential applied to the first gate terminal G1 and wherein the buffer stage 538 is electrically controllable through a potential applied to the second gate terminal G2. A semiconductor portion of the double-gate field effect transistor 530 includes a source zone, a drain region and a body zone. The body zone separates the source zone and the drain region and forms pn junctions with the source zone and the drain region. A first gate structure electrically connected to the first gate terminal G1 directly adjoins a first portion of the body zone and a second gate structure electrically connected to the second gate terminal G2 directly adjoins a second portion of the body zone.

The first and second gate portions extend from a first surface of the semiconductor portion into the semiconductor portion. The first gate portion may include a plurality of neighboring sub-portions arranged in a row direction on opposite sides of the first portions of the body zone. The second gate portion may include a plurality of neighboring sub-portions on opposite sides of the second portions of the body zone. The buried first and second gate portions facilitate low gate currents and comparatively high mixing frequencies.

Figure 11B:
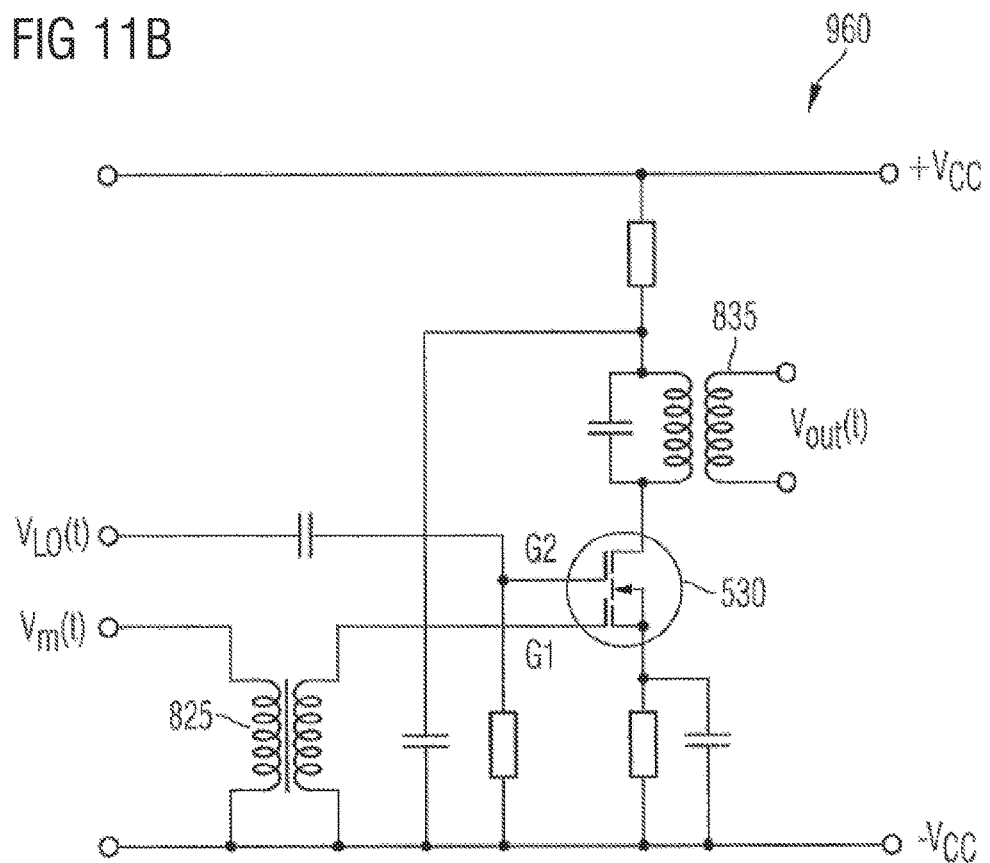
FIG. 11B is a simplified circuit diagram of a heterodyne receiver circuit including a double-gate field effect transistor according to another embodiment.

The frequency mixer circuit 960 in FIG. 11B is a heterodyne receiver. The modulation signal $V_m(t)$ is an RF (radio frequency) signal and may be fed to the first gate terminal G1 of the double gate FET 530 through a transformer 825. The local oscillator signal $V_{LO}(t)$ may be capacitively coupled to the second gate terminal G2 through a capacitor 826. The output circuit 596 may include a further transformer 835 for tapping the output signal $V_{out}(t)$ that contains the heterodynes.

Figure 12:
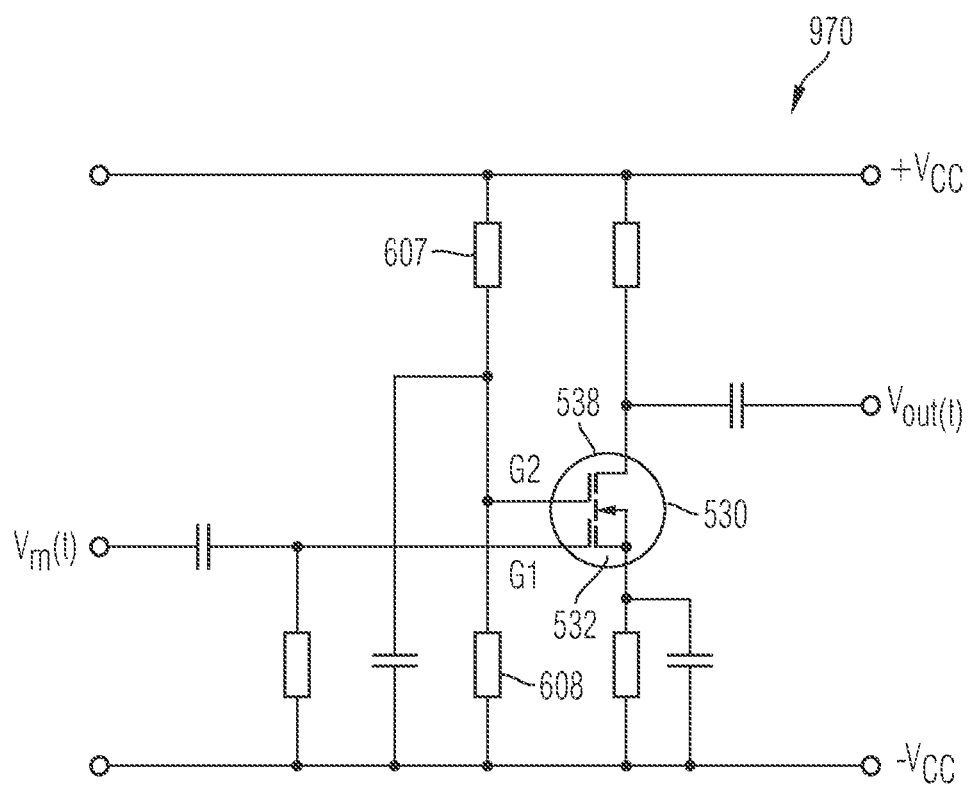
FIG. 12 is a schematic circuit diagram of an amplifier circuit including a double-gated field effect transistor with gate structures extending from a first surface into a semiconductor portion according to a further embodiment.

The amplifier circuit 970 of FIG. 12 includes a dual gate FET 530 in a cascode configuration as described above. The amplifier stage 532 with the first gate terminal G1 is in a common-source configuration. The buffer stage 538 is in a common-gate configuration biased through a voltage divider with resistors 607, 608.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A switched-mode power converter, comprising:
    an inductive storage element;
    a cascode circuit comprising a double-gate field effect transistor, wherein a switchable load path of the double-gate field effect transistor is electrically connected in series with the inductive storage element; and
    a voltage tapping circuit electrically coupled to a second gate terminal of the double-gate field effect transistor, wherein a voltage applied to the second gate terminal controls a buffer stage of the double-gate field effect transistor, the buffer stage oriented to a drain terminal of the double-gate field effect transistor.

2. The switched-mode power converter of claim 1, further comprising:
    a gate driver circuit electrically coupled to a first gate terminal of the double-gate field effect transistor, wherein a voltage applied to the first gate terminal controls an amplifier stage of the double-gate field effect transistor oriented to a source terminal of the double-gate field effect transistor.

3. The switched-mode power converter of claim 1, wherein
    the power converter is a DC/DC converter.

4. The switched-mode power converter of claim 1, wherein
    a gate driver circuit includes the voltage tapping circuit.

5. The switched-mode power converter of claim 1, wherein
    the buffer stage is physically between the amplifier stage and a drain electrode of the double-gate field effect transistor, the drain electrode connected to the drain terminal.

6. The switched-mode power converter of claim 1, wherein
    the double-gate field effect transistor comprises a body zone with a first portion assigned to the amplifier stage and a second portion assigned to the buffer stage and structurally connected with the first portion.

7. The switched-mode power converter of claim 1, wherein
    a semiconductor portion of the double-gate field effect transistor comprises a plurality of transistor cells electrically connected in parallel.

8. The switched-mode power converter of claim 1, wherein
    a semiconductor portion of the double-gate field effect transistor comprises a source zone, a drain region, a body zone separating the source zone and the drain region and forming pn junctions with the source zone and the drain region, a first gate structure directly adjoining a first portion of the body zone and a second gate structure directly adjoining a second portion of the body zone.

9. The switched-mode power converter of claim 8, further comprising:
    a connection zone forming a pn junction with the body zone and formed between the first portion and the second portion of the body zone.

10. The switched-mode power converter of claim 8, wherein
    the drain region is formed at a lateral distance to the source zone parallel to a first surface of the semiconductor portion.

11. The switched-mode power converter of claim 10, wherein
    the first and second gate structures extend from the first surface into the body zone.

12. The switched-mode power converter of claim 8, wherein
    the drain region is formed at a vertical distance to the source zone perpendicular to a first surface of the semiconductor portion.

13. The switched-mode power converter of claim 1, wherein
    the power converter is a buck converter.

14. The switched-mode power converter of claim 1, wherein
    the power converter is a boost converter.

15. A frequency mixer circuit, comprising:
    a double-gate field effect transistor, wherein a semiconductor portion of the double-gate field effect transistor comprises a source zone, a drain region, a body zone separating the source zone and the drain region and forming pn junctions with the source zone and the drain region;
    a first gate structure extending from a first surface of the semiconductor portion into the body zone and directly adjoining a first portion of the body zone, the first gate structure comprising a conductive first gate electrode and a first gate dielectric separating the first gate electrode at least from the body zone, and
    a second gate structure extending from the first surface of the semiconductor portion into the body zone and directly adjoining a second portion of the body zone, the second gate structure comprising a conductive second gate electrode and a second gate dielectric separating the second gate electrode at least from the body zone.

16. The frequency mixer circuit of claim 15, wherein the drain region is formed at a lateral distance to the source zone parallel to a first surface of the semiconductor portion.

17. The frequency mixer circuit of claim 15, further comprising:
a connection zone between the first portion and the second portion of the body zone and forming a pn junction with the body zone.

* * * * *